(12) United States Patent
Usami

(10) Patent No.: US 8,309,296 B2
(45) Date of Patent: Nov. 13, 2012

(54) METHOD FOR PROCESSING WORKPIECE WITH PHOTORESIST LAYER

(75) Inventor: Yoshihisa Usami, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 155 days.

(21) Appl. No.: 12/921,116

(22) PCT Filed: Dec. 15, 2008

(86) PCT No.: PCT/JP2008/003762
§ 371 (c)(1),
(2), (4) Date: Sep. 3, 2010

(87) PCT Pub. No.: WO2009/110046
PCT Pub. Date: Sep. 11, 2009

(65) Prior Publication Data
US 2011/0003255 A1 Jan. 6, 2011

(30) Foreign Application Priority Data
Mar. 5, 2008 (JP) ................................. 2008-055611

(51) Int. Cl.
*G03F 7/20* (2006.01)

(52) U.S. Cl. ........................ 430/313; 430/395

(58) Field of Classification Search .................. 430/323, 430/313, 395
See application file for complete search history.

(56) References Cited

U.S. PATENT DOCUMENTS

| | | | | |
|---|---|---|---|---|
| 4,897,325 A | * | 1/1990 | Akkapeddi et al. | 430/5 |
| 5,501,944 A | | 3/1996 | Hill et al. | |
| 5,656,229 A | | 8/1997 | Tanimoto et al. | |
| 6,136,509 A | * | 10/2000 | Gelbart | 430/311 |
| 6,906,777 B1 | | 6/2005 | Kye et al. | |
| 2004/0152011 A1 | * | 8/2004 | Chen et al. | 430/270.1 |
| 2004/0241589 A1 | | 12/2004 | Ito et al. | |
| 2007/0069429 A1 | | 3/2007 | Albrecht et al. | |

FOREIGN PATENT DOCUMENTS

| | | |
|---|---|---|
| EP | 0 605 103 A1 | 7/1994 |
| GB | 2 080 598 A | 2/1982 |
| JP | 61-237313 A | 10/1986 |
| JP | 01-091385 A | 4/1989 |
| JP | 03-144646 A | 6/1991 |
| JP | 04-209517 A | 7/1992 |
| JP | 04-345921 A | 12/1992 |
| JP | 07-100670 A | 4/1995 |

(Continued)

OTHER PUBLICATIONS

First Office Action, dated Sep. 30, 2011, issued in corresponding CN Application No. 20088012773.9, 10 pages in English and Chinese.

(Continued)

*Primary Examiner* — Cynthia Kelly
*Assistant Examiner* — Caleen Sullivan
(74) *Attorney, Agent, or Firm* — Sughrue Mion, PLLC

(57) ABSTRACT

A method for processing a workpiece (10) having a photoresist layer (12) using an exposure device (30) is disclosed. A transparent sheet (20) which allows transmission of light emitted from the exposure device (30) is disposed between an object lens (35*a*) of the exposure device (30) and the photoresist layer (12), and the photoresist layer (12) is exposed to the light through the transparent sheet (20).

12 Claims, 3 Drawing Sheets

FOREIGN PATENT DOCUMENTS

| | | |
|---|---|---|
| JP | 08-124226 A | 5/1996 |
| JP | 08-212602 A | 8/1996 |
| JP | 11-238669 A | 8/1999 |
| JP | 2001-195784 A | 7/2001 |
| JP | 2001-250280 A | 9/2001 |
| JP | 2003-066852 A | 3/2003 |
| JP | 2004-213707 A | 7/2004 |
| JP | 2005-011489 A | 1/2005 |
| JP | 2006-308996 A | 11/2006 |
| JP | 2006-309908 A | 11/2006 |
| JP | 2007-094410 A | 4/2007 |
| WO | WO 99/41077 A1 | 8/1999 |
| WO | 2006/118343 A1 | 11/2006 |

OTHER PUBLICATIONS

Communication, dated Nov. 24, 2011, issued in corresponding EP Application No. 08873154.2, 6 pages.

Japanese Office Action issued in Japanese Patent Application No. 2008-055611 dated Dec. 27, 2011.

* cited by examiner (a)

(b)

(c)

(d)

METHOD FOR PROCESSING WORKPIECE WITH PHOTORESIST LAYER

TECHNICAL FIELD

The present invention relates to a processing method for processing a workpiece having a photoresist layer using an exposure device.

BACKGROUND ART

A method for performing a fine patterning on a workpiece is generally known as a fine patterning technique, in which a photoresist is applied on the surface of a target object to be processed (i.e., workpiece), the photoresist is then finely exposed to light using a laser exposure device, and finally etching is performed.

In order to expose a photoresist layer to light, for example, Japanese Laid-open Patent Application, Publication No. 04-345921 discloses a method for forming recessed portions by causing the photoresist layer to absorb light, so that due to generated heat, the photoresist material is decomposed, vaporized, and scattered. As with this method, if processing is performed using the heat derived from light, only that portion which reaches a predetermined temperature or more undergoes a change of shape. Therefore, unlike a chemical change due to exposure of light, a so-called super-resolution processing method is available which can form a fine hole having a diameter smaller than the light spot. This processing is carried out using a device similar to a pickup for an optical disc, and is advantageous in terms of achieving a cheap and high-speed fine processing. A further advantage is that a development of the photoresist layer becomes unnecessary and the processing of the workpiece can be performed by a simple process.

However, if the so-called thermally deformable heat mode resist-type photoresist layer is exposed to light for processing as described above, scattered materials derived from the photoresist material often attach to an object lens of the exposure device and therefore it is necessary to frequently clean the object lens.

Further, when a fine processing is performed by condensing the light beam to a narrow beam at the time of exposure, it is a customary practice to increase the numerical aperture (NA) of the object lens. However, increasing the NA will result in decreased focal length, and hence the distance between the workpiece and the object lens becomes shorter, so that even a slight vibration will cause a collision of the object lens with the workpiece and disadvantageously damage the workpiece. This disadvantage is particularly noticeable in the case of an autofocus servo control because the object lens is moved.

In view of the above disadvantage, the present invention seeks to provide a processing method which can prevent a workpiece from being damaged and in the case of using a thermally deformable heat mode resist-type photoresist material, prevent an object lens from being soiled.

DISCLOSURE OF THE INVENTION

In order to solve the above disadvantage, the present invention provides a method for processing a workpiece having a photoresist layer using an exposure device, the method comprising the steps of: disposing an object which allows transmission of light emitted from the exposure device, between an object lens of the exposure device and the photoresist layer; and exposing the photoresist layer to the light through the object.

According to the this method, since the object which allows transmission of light emitted from the exposure device is disposed between the photoresist layer and the object lens of the exposure device, even if the object lens collides with the object due to some vibration, the object lens does not directly contact with the photoresist layer. This can prevent a damage of the photoresist layer. Therefore, it is possible to enhance yield of the product. Further, the object lens can be moved closer to the photoresist layer, which results in that a lens with a larger NA can be used as the object lens and the exposure of the photoresist layer can be performed with light having a fine spot size.

The object according to the present invention may be able to transmit light emitted from the exposure device to such an extent that the exposure device can effectively perform the exposing process without any trouble.

In the above method, the photoresist layer may be made of a thermally deformable heat mode-type material.

If the photoresist layer is made of a thermally deformable heat mode material, the photoresist layer undergoes a change of shape and scatters when it is exposed to light by the exposure device. However, according to the present invention, since the object is disposed between the photoresist layer and the object lens, the scattered materials do not attach to the object lens. Therefore, the number of cleaning cycles for cleaning the object lens can be reduced, which leads to improvement in the production efficiency. Further, since the scattered materials are mainly attached to the object and the amount of scattered materials attached to the photoresist layer is decreased accordingly, it is possible to improve the accuracy of the shape of asperities processed and formed on the photoresist layer and to facilitate, or eliminate the need for, cleaning the scattered materials.

In the above method, the photoresist layer is exposed to light and subsequently the workpiece may be etched using the photoresist layer as a mask.

This makes it possible to form the shape of the asperities on the workpiece corresponding to the exposure pattern.

In the above method, the object may preferably be disposed so as to contact with the photoresist layer.

According to this arrangement, a relative speed between the object and the photoresist layer becomes zero (0) during the exposure, and if the object lens collides with the workpiece, a damage of the photoresist layer can be prevented in a more reliable manner. Further, even if scattered materials generate from the photoresist layer, they are apt to attach to the object because no air current generates between the object and the photoresist layer, so that the risk of the scattered materials flowing and spreading between the object and the photoresist layer and then falling again onto the photoresist layer can be restricted.

According to the present invention, the contact of the object with the photoresist layer does not strictly mean that substances are completely contact with each other in micron level. Instead, the object naturally contacts with the photoresist layer to such an extent that an integrated movement of the object and the workpiece is allowable. Namely, in the case where the object and the photoresist layer are smoothly contacted with each other, air is inevitably interposed between them. The term "contact" according to the present invention includes this state. Other substances, for example, some liquid or solid may be interposed in addition to air. Of course, the object may be made of a sticky material so that the object and the photoresist layer are completely sealed by removing air from between the object and the photoresist layer.

In the case where the object and the photoresist layer are in contact with each other, it is preferable that fine particles are interposed between the photoresist layer and the object.

As described previously, if the object and the photoresist layer are in contact with each other, in general, an air layer is inevitably interposed between the object and the photoresist layer. Therefore, if the object partly approaches the photoresist layer, interference fringes of light, i.e., Newton's ring can be generated in this place. The presence of such interference fringes may influence on the focusing performance during the exposure. However, since fine particles are interposed, a fine gap can be ensured between the object and the photoresist layer to prevent an occurrence of interference fringes.

In the above method, the exposing step may comprise rotating the workpiece while the workpiece is exposed to light.

Further, in the above method, the exposing step may comprise fixing the object to the workpiece using a cramp. As an alternative, the exposing step may comprise bonding the object to the workpiece prior to the exposure of the photoresist layer in such a manner that the object is removable from a surface of the photoresist layer to be processed.

Accordingly, a relative movement between the object and the workpiece can be prevented in a reliable manner, and it is possible to more reliably prevent a damage of the photoresist layer.

In the above method, the object may have a sheet-like configuration. In this instance, it is preferable that the sheet-like object has a thickness in a range of 1-80% of a distance between the object lens and the photoresist layer.

As described above, according to the processing method of the present invention, even if the object lens of the exposure device collides with the workpiece, for example, due to vibration, a damage of the photoresist layer can be prevented and thus the yield of the product can be enhanced. Further, in the case where the photoresist layer is made of a thermally deformable heat mode material, it is possible to prevent the object lens from being soiled by the scattered materials generated from the photoresist layer.

BEST MODE FOR CARRYING OUT THE INVENTION

Next, a processing method according to the present invention will be described with reference to the drawings.

Figure 1:
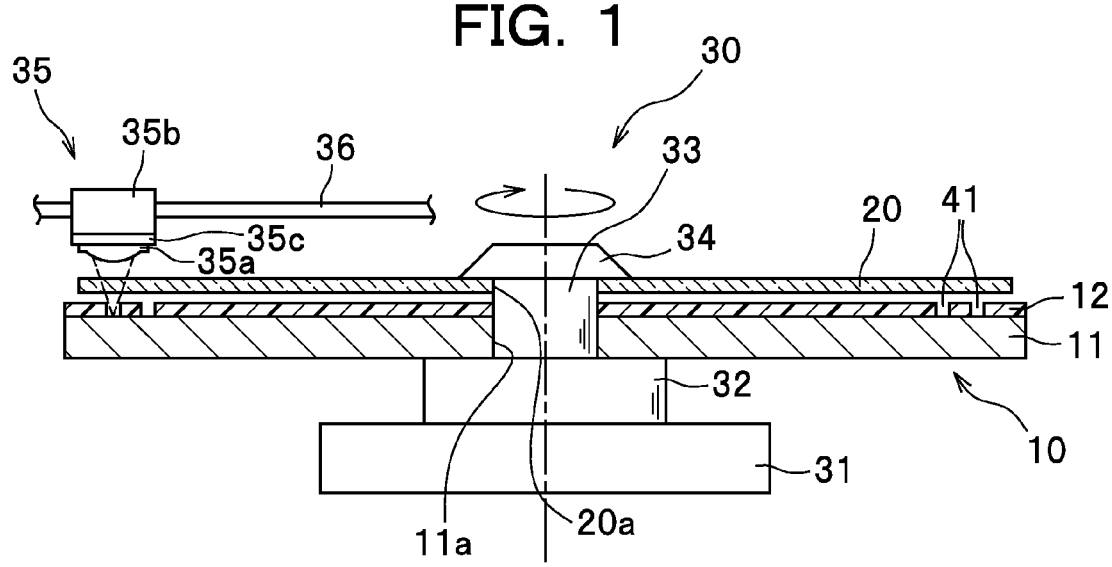
FIG. 1 is a view explaining an exposure device.

As seen in FIG. 1, a workpiece 10 as processed by the method of the present invention includes a substrate 11, and a photoresist layer 12 provided on a front surface of the substrate 11. Although the workpiece 10 is illustrated in the most simple configuration for the purpose of better understanding the present invention, one or more other layers may be provided in addition to the substrate 11 and the photoresist layer 12.

According to this embodiment, as an example, the workpiece 10 is a stamper used as a mold for manufacturing an optical recording disc. However, the present invention is not limited to this stamper. For example, the present invention is applicable to an optical element used for an LED (Light Emitting Diode), an EL (Electro-Luminescence) element, a liquid crystal display, or an FED (Field Emission Display), which has fine surface asperities; a semiconductor device used for an integrated circuit chip; a metal mold used for molding a product having fine surface asperities.

The substrate 11 has a circular plate-like configuration and a through-hole 11a is formed in its center for the insertion of a spindle shaft 33 to be described later. The material for the substrate 11 is not limited and for example, Si or various other metals may be used.

The photoresist layer 12 is provided on the substrate 11, for example, by spin coating. The coating liquid for forming the photoresist layer 12 is prepared by dissolving a compound constituting the photoresist layer 12 in an organic solvent. For example, when a thermally deformable heat mode-type photoresist layer 12 is formed, the coating liquid may be prepared by dissolving a dye material given by the following chemical formula 1 in TFP (tetrafluoropropanol) solvent as an organic solvent at 2% (ratio by weight).

[Chem. 1]

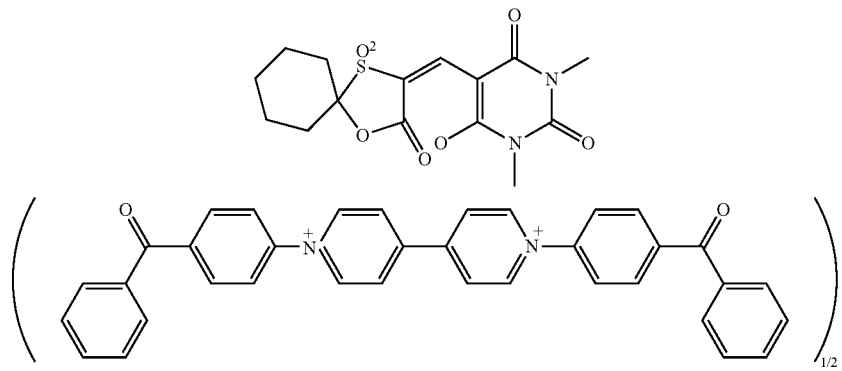

Although the thickness of the photoresist layer 12 differs in accordance with a kind of the workpiece 10, it is preferable to form the photoresist layer 12 as thin as possible if fine asperities are formed on the photoresist layer 12. For example, in the case where fine asperities are formed on the photoresist layer 12 with a width equal to or smaller than 1 μm, the upper limit value of the thickness of the photoresist layer 12 is preferably 1 μm or less, more preferably 0.5 μm or less, and particularly preferably 0.3 μm or less. The lower limit value of the thickness of the photoresist layer 12 is preferably 0.01 μm or more, more preferably 0.03 μm or more, and particularly preferably 0.05 μm or more.

The workpiece 10 is provided with a transparent sheet 20 on the side where the photoresist layer 12 is formed. The transparent sheet 20 is an example of an object which allows transmission of light emitted from the exposure device. As with the workpiece 10, the transparent sheet 20 has a substantially circular plate-like configuration as viewed from top, and a through-hole 20a is formed in its center for the insertion of the spindle shaft 33 to be described later.

The upper limit of the thickness of the transparent sheet 20 is preferably 80% or less of the distance between an object lens 35a to be described later and the photoresist layer 12, more preferably 60% or less of the distance, and particularly preferably 50% or less of the distance. If the transparent sheet 20 is too thick, the exposure head 35 frequently collides with the transparent sheet 20 because of a dispersion of the position of an exposure head 35 to be described later, which leads to a difficulty in controlling. The lower limit of the thickness of the transparent sheet 20 is preferably 1% or more of the distance between the object lens 35a and the photoresist layer 12, more preferably 5% or more of the distance, and particularly preferably 10% or more of the distance. If the transparent sheet 20 is too thin, the transparent sheet 20 will disadvantageously get wrinkled during handling.

Figure 2:
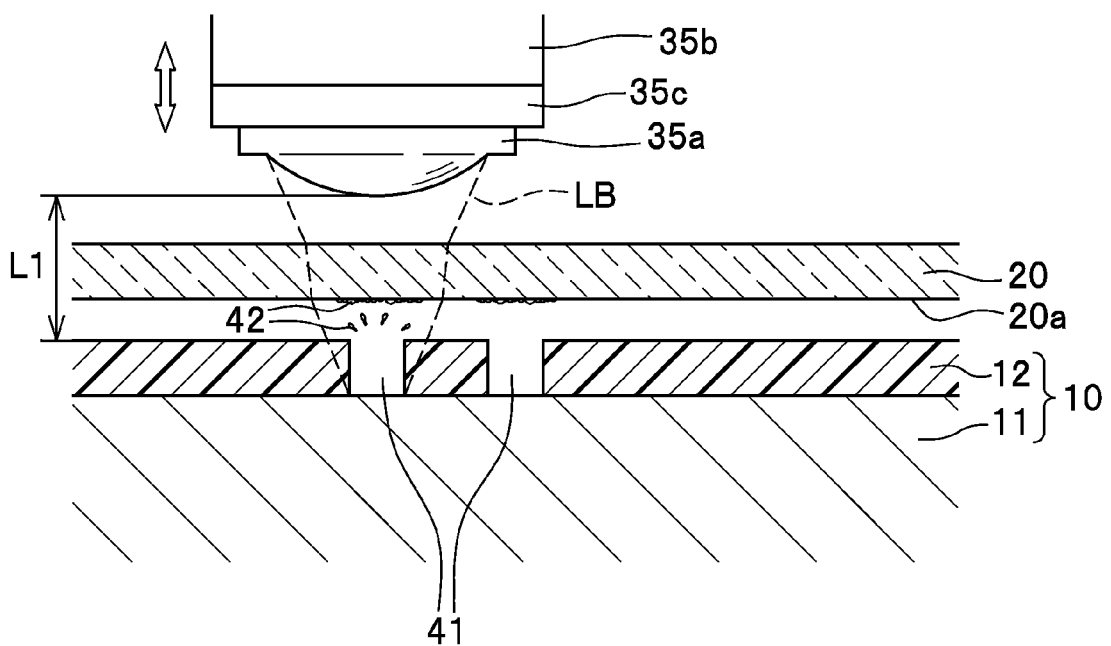
FIG. 2 is an enlarged view showing an exposed portion.

Further, it is preferable that the surface 20b of the transparent sheet 20 facing the photoresist layer 12 (see FIG. 2) is positioned in a region on a photoresist layer 12 side with reference to the intermediate position between the surface of the object lens 35a and the surface of the photoresist layer 12. More preferably, if the distance between the object lens 35a and the photoresist layer 12 is defined as L1 as shown in FIG. 2, the surface 20b is positioned in a region ranging preferably within 30%, and more preferably within 20% of the distance L1 from the photoresist layer 12. To be more specific, the surface 20b of the transparent sheet 20 is positioned preferably in a region within 0.5 mm, more preferably in a region within 0.3 mm, and most preferably in a region within 0.1 mm from the surface of the photoresist layer 12.

The transparent sheet 20 may be adapted to transmit light emitted from the exposure device to such an extent that the exposure device 30 can effectively perform the exposure without any trouble; for example, the transmissivity for a laser beam emitted from a laser beam source is 50% or more, more preferably 70% or more, and particularly preferably 80% or more. If the transmissivity for the laser beam is lower, the exposure of the photoresist layer 12 is inefficiently performed, which leads to increased exposure time and increased heat generation from the transparent sheet 20.

As long as the transparent sheet 20 has the above light transmissivity, the transparent sheet 20 may be made of any known materials, such as PC (polycarbonate), olefin, TAC (cellulose triacetate), PET (polyethylene terephthalate), glass, and $SiO_2$. Of these materials, PC, olefin, TAC are preferable. Preferably, the transparent sheet 20 has a lower birefringence, and the phase difference thereof is preferably 500 nm or less, more preferably 200 nm or less, and most preferably 100 nm or less. The thickness of the transparent sheet 20 is preferably 1.5 mm or less, more preferably 0.7 mm or less, and most preferably 0.2 mm or less.

The exposure device 30 includes a stationary stage 31, a rotary stage 32, a spindle shaft 33, a clamp 34, an exposure head 35, and a guide 36.

The rotary stage 32 is provided on the stationary stage 31 so as to be rotatable integrally with the spindle shaft 33 and the clamp 34, and a rotary driving force is input to the rotary stage 32 from a motor (not shown).

The spindle shaft 33 is formed as a shaft that is thinner than the rotary stage 32.

The spindle shaft 33 is inserted into the through-hole 11a of the workpiece 10 and the through-hole 20a of the transparent sheet 20.

The clamp 34 is provided on top of the spindle shaft 33, and is fastened by a screw or urged downward by means of a spring. Therefore, the workpiece 10 is held between the rotary stage 32 and the clamp 34. In other words, the transparent sheet 20 is pressed by the clamp 34 toward and against the workpiece 10 and is fixed to the workpiece 10. It is to be understood that although each of the attached drawings shows the photoresist layer 12 and an air layer interposed between the photoresist layer 12 and the transparent sheet 20 in contact with the photoresist layer 12 in an exaggerated manner, when the transparent sheet 20 is pressed against the substrate 11 using the clamp 34, the inner peripheral portion of the pressed transparent sheet 20 closely contacts with the photoresist layer 12.

The exposure head 35 may employ a device similar to an optical pickup used in a reading device for an optical disc such as a CD, a DVD, a Blu-ray (registered trademark) disc.

The exposure head 35 includes an object lens 35a, a scanning device 35b, a focus actuator 35c, and a laser light source (not shown). The object lens 35a is moved in an optical axis direction by the focus actuator 35c, so that a laser beam emitted from the laser light source is converged on the photoresist layer 12. The guide 36 is provided along a radial direction of the workpiece 10, and the scanning device 35b is adapted to cause the exposure head 35 to move along the guide 36.

The laser beam emitted from the laser light source preferably has a wavelength of 405 nm or 660 nm, and most preferably 405 nm.

The exposure device 30 configured as described above performs exposure on the photoresist layer 12 by emitting a laser beam from the laser light source while rotating the workpiece 10 with the rotary stage 32 under control of a controller (not shown). During this time, the controller controls the focus actuator 35c such that the laser beam is converged on the photoresist layer 12. Further, the controller controls the scanning device 35b such that the exposure device 30 moves in a direction from an inner perimeter to an outer perimeter of the workpiece 10 or in a direction from the outer perimeter to the inner perimeter of the workpiece 10. Therefore, the entire surface of the photoresist layer 12 can be exposed to the laser beam.

During the exposure of the photoresist layer 12 by the exposure device 30, as seen in FIG. 2, only that portion of the photoresist layer 12 which is illuminated with the laser beam LB absorbs the laser beam LB, so that due to generated heat, the photoresist material is scattered as a result of vaporization, sublimation, decomposition or the like. Therefore, the photoresist layer 12 undergoes a change of shape and a recessed portion 41 is formed accordingly. Since the photoresist layer 12 is made of a thermally deformable heat mode material, the recessed portion 41 is formed only in an area having an increased temperature. Namely, it is possible to form a recessed portion 41 having an extremely narrow width that is smaller than the diameter of the laser beam.

Scattered materials 42 derived from the photoresist material are attached to the surface of the transparent sheet 20 that is facing opposite to the photoresist layer 12. Since the scattered materials 42 from the photoresist material do not attach to the object lens 35a, the number of cleaning cycles for cleaning the object lens 35a can be reduced. This can lead to improvement in the production efficiency.

Further, according to this embodiment, since the transparent sheet 20 directly contacts with the photoresist layer 12, any undesired air current does not occur between the photoresist layer 12 and the transparent sheet 20, and the scattered photoresist materials attach to the transparent sheet 20 without being flowed by a generated air current. Therefore, the risk of the photoresist layer 12 being soiled by the scattered photoresist materials can be reduced.

The focus actuator 35c slightly moves the object lens 35a in the optical axis direction. however, according to the processing method as described in this embodiment, even if the object lens 35a contacts with the transparent sheet 20 due to a focusing action or an external vibration, the photoresist layer 12 is less likely to be damaged. Further, since the transparent sheet 20 is in contact with the photoresist layer 12 and is fixed to the substrate 11 by the cramp 34, a relative speed between the transparent sheet 20 and the photoresist layer 12 becomes zero (0) during the exposure, and if the object lens 35a collides with the transparent sheet 20, the photoresist layer 12 is hardly damaged.

Figure 3:
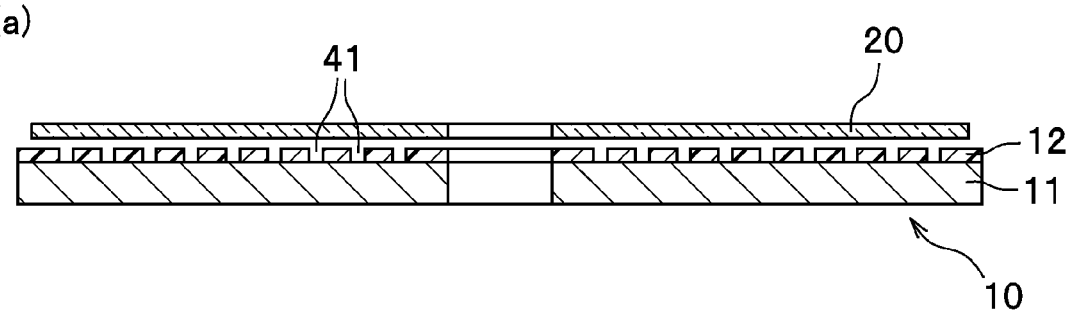
FIG. 3 includes views (a) to (d) for explaining processing steps for a substrate after the substrate is exposed to light.
Figure 3:
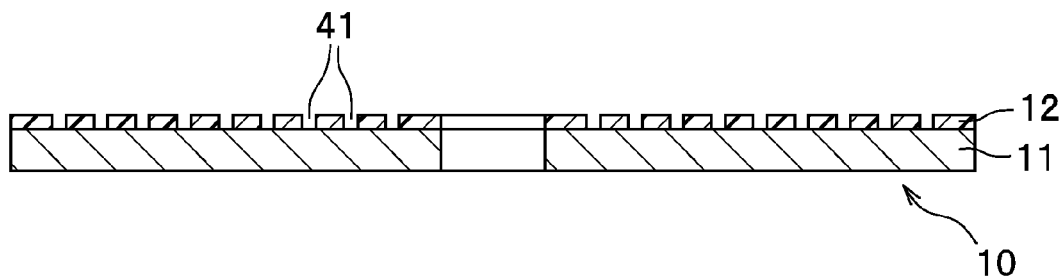
Figure 3:
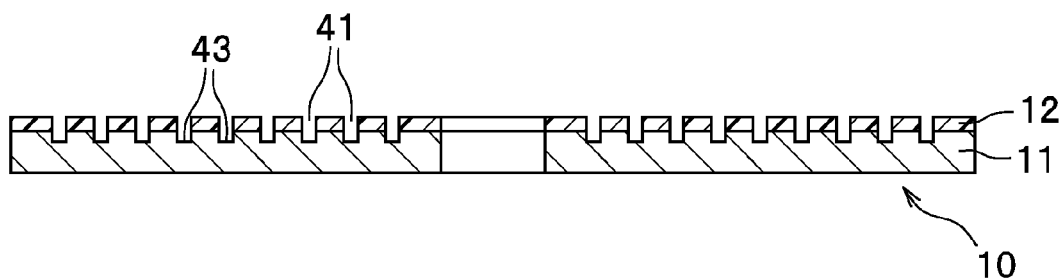
Figure 3:
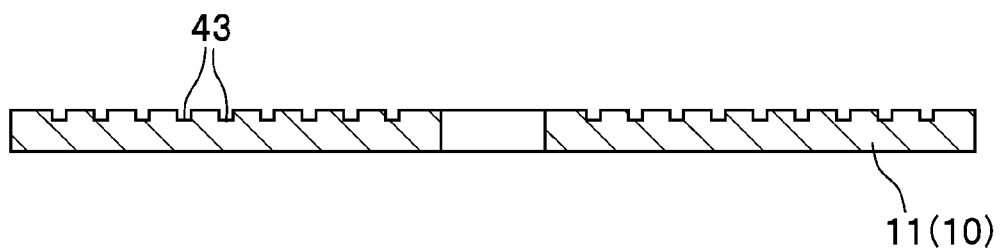

With respect to the workpiece 10 having an asperity pattern in the photoresist layer 12 as described above, a shape of asperities can be formed in the substrate 11 by processing steps such as shown in FIG. 3. As seen in FIG. 3(a), recessed portions 41 are formed in the photoresist layer 12 and the surface of the substrate 11 is partly exposed from the photoresist layer 12. Thereafter, as seen in FIG. 3(b), the transparent sheet 20 is removed from the photoresist layer 12. Next, as seen in FIG. 3(c), etching is carried out with the photoresist layer 12 used as a mask so that recessed portions 43 are formed in the surface of the substrate 11. The etching performed herein may adopt various etching methods which include wet etching, dry etching, RIE (reactive ion etching), or the like.

After the recessed portions 43 are formed, as seen in FIG. 3(d), the photoresist layer 12 is removed with a cleaning liquid such as ethanol, so that a pattern of asperities made by the recessed portions 43 can be formed on the surface of the substrate 11.

Although the method according to one exemplary embodiment of the present invention has been described above, the method of the present invention may be implemented with modifications made where appropriate.

Figure 4:
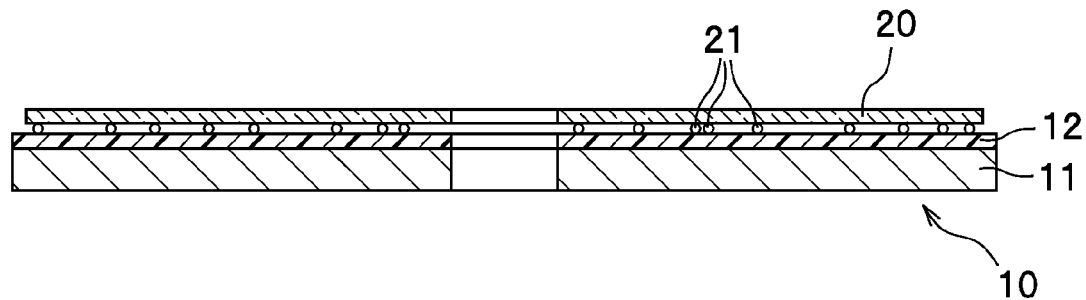
FIG. 4 is a view explaining an example in which fine particles are interposed between a photoresist layer and a transparent sheet.

For example, as seen in FIG. 4, the exposure may be carried out in such a manner that fine particles 21 are interposed between the photoresist layer 12 and the transparent sheet 20. Interposing the fine particles 21 in this manner can prevent an occurrence of interference fringes when the transparent sheet 20 and the photoresist layer 12 locally approach to each other, and a focusing of the laser beam LB and an exposure using the exposure device 30 can be performed appropriately.

Conditions of the fine particles 21 for this exposure are determined for ensuring a focusing of the exposure device, and therefore, a mean particle diameter of the fine particles is preferably 100 μm or less, more preferably 30 μm or less, and most preferably 10 μm or less. Further, the mean particle diameter is preferably 0.01 μm or more, more preferably 0.1 μm or more, and most preferably 0.5 μm or more. If the particle diameter of the fine particles 21 is too large, a focusing servo becomes unstable because of the presence of the fine particles 21. On the contrary, if the particle diameter is too small, it becomes hard to prevent an occurrence of interference fringes and the focusing servo becomes unstable.

The term "mean particle diameter" according to the present invention indicates a value measured with laser diffractometry.

In order to prevent the fine particles 21 from adversely affecting the exposure, the fine particles 21 are preferably dispersed such that a rate of the fine particles 21 disposed within a given area of the surface of the photoresist layer 12 is preferably 1% or less, more preferably 0.1% or less, and most preferably 0.01% or less.

Figure 5:
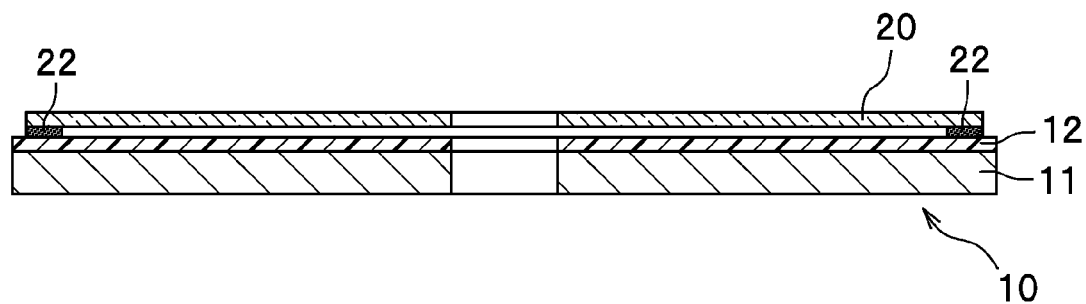
FIG. 5 is a view showing an example in which a portion in close proximity of an outer peripheral edge of the transparent sheet is bonded to the substrate.

During the exposure, as seen in FIG. 5, the transparent sheet 20 may be bonded to the workpiece 10 only at a portion in close proximity of an outer peripheral edge of the transparent sheet 20 using adhesive 22. This can reliably prevent a relative movement between the transparent sheet 20 and the workpiece 10, and it is possible to more reliable prevent a damage of the photoresist layer. In this instance, if an outer peripheral edge portion of the photoresist layer 12 is not subject to processing, the adhesive 22 may be a strong adhesive because the transparent sheet 20 can be removed from the photoresist layer 12 without damaging the surface to be processed. The manner of adhering the transparent sheet 20 to the workpiece 10 may be any known methods as long as the surface to be processed of the photoresist layer 12 can be separated without being damaged. For example, if a pressure-sensitive adhesive which excels in release property from the photoresist layer 12 is used, the entire surface of the transparent sheet 20 can be adhered to the workpiece 10.

Further, although the method according to the above exemplary embodiment of the present invention employs a thermally deformable heat mode photoresist layer 12, the photoresist layer 12 which does not undergo a change of shape may be adopted, instead. In this example, too, the photoresist layer 12 is exposed to light through a transparent object, so that even if the object lens 35a collides with the workpiece 10 due to some vibration or the autofocus control of the object lens 35a, it is possible to prevent the photoresist layer 12 from being damaged. This can enhance yield of the product. Further, the object lens 35a can be moved closer to the photoresist layer 12, which results in that a lens with a larger NA can be used as the object lens 35a and the exposure of the photoresist layer 12 can be performed with a laser beam having a fine beam diameter.

In the above embodiment, a plate-like workpiece 10 is used. However, the workpiece 10 is not limited to one which has a plate-like configuration, and may have an arbitrary shape such as a cylindrical-shape, a barrel-shape, a spherical-shape. Further, the plate-like workpiece 10 is not limited to an example having a circular plate-like configuration, and may have another configuration such as a rectangular card-shape.

In the above embodiment, a laser beam is used as light emitted from the exposure device 30. However, the light is not limited to the laser beam. As long as the light can be condensed to a required size, another kind of light other than a monochromatic light may be used as well.

Further, in the above embodiment, the workpiece 10 is retained using the clamp 34 which presses the transparent sheet 20 against the substrate 11. However, a simplified chuck as used for retaining a CD or a DVD may be used instead.

In the above embodiment, the workpiece 10 is moved while the entire surface of the photoresist layer 12 is exposed to light. However, the exposure head 35 may be moved while the workpiece 10 is stationarily retained, so that the entire surface of the photoresist layer 12 can be exposed to light.

In the above embodiment, a material given by the chemical formula 1 is used as the dye material dissolved in the coating liquid. However, the present invention is not limited to this specific example. For example, preferred examples of material for use in the photoresist layer 12 having a dye material may include methine dyes (cyanine dyes, hemicyanine dyes, styryl dyes, oxonol dyes, merocyanine dyes, etc.), large ring dyes (phthalocyanine dyes, naphthalocyanine dyes, porphyrin dyes, etc.), azo dyes (including an azo-metal chelate dye), arylidene dyes, complex dyes, coumarin dyes, azole derivatives, triazine derivatives, 1-aminobutadiene derivatives, cinnamic acid derivatives, quinophthalone dyes, etc. Of these, methine dyes, oxonol dyes, large ring dyes and azo dyes may be preferable.

In particular, the dye-type photoresist layer 12 may preferably contain a dye having absorption in the range of exposure light wavelengths. Particularly, the upper limit of an extinction coefficient k indicating the amount of light absorption may preferably be 10 or less, more preferably 5 or less, still more preferably 3 or less, and most preferably 1 or less. This is because too high extinction coefficient k would prevent light incident on one side of the photoresist layer 12 from reaching or passing through the opposite side, thus rendering the holes formed in the photoresist layer 12 uneven. On the other hand, the lower limit of the extinction coefficient k may preferably be 0.0001 or more, more preferably 0.001 or more, and still more preferably 0.1 or more. This is because too low extinction coefficient k would reduce the amount of light absorption, which would make a higher laser power necessary and reduce the production speed.

It is to be understood that the photoresist layer 12 needs to have absorption of light in the range of exposure light wavelengths; with this in view, the selection of an appropriate dye and/or alteration of its structure may be made in accordance with the wavelength of the laser beam produced by the laser light source.

For example, in the case where the oscillation wavelength of the laser beam emitted from the laser light source is around 780 nm, it is advantageous to select dyes such as pentamechine cyanine dyes, heptamechine oxonol dyes, pentamethine oxonol dyes, phthalocyanine dyes, and naphthalocyanine dyes. Of these, phthalocyanine dyes or pentamethine cyanine dyes may be used preferably in particular.

In the case where the oscillation wavelength of the laser beam emitted from the laser light source is around 660 nm, it is advantageous to select dyes such as trimechine cyanine dyes, pentamethine oxonol dyes, azo dyes, azo-metal complex dyes, and pyrromethene complex dyes.

Further, in the case where the oscillation wavelength of the laser beam emitted from the laser light source is around 405 nm, it is advantageous to select dyes such as monomechine cyanine dyes, monomechine oxonol dyes, zero-mechine merocyanine dyes, phthalocyanine dyes, azo dyes, azo-metal complex dyes, porphyrin dyes, arylidene dyes, complex dyes, coumarin dyes, azole derivatives, triazine derivatives, benzotriazole derivatives, 1-aminobutadiene derivatives, and quinophthalone dyes.

Examples of preferred compounds for use in the photoresist layer 12 (i.e., as a photoresist material) are shown below in the cases where the oscillation wavelength of the laser beam emitted from the laser light source is around 780 nm, around 660 nm, and around 405 nm, respectively. Compounds given by (I-1) to (I-10) in the following chemical formulae 2, 3 are suitable in the case where the oscillation wavelength of the laser beam is around 780 nm. Compounds given by formulae (II-1) to (II-8) in the chemical formulae 4, 5 are suitable in the case where the oscillation wavelength of the laser beam is around 660 nm, and compounds given by (III-1) to (III-14) in the chemical formulae 6, 7 are suitable in the case where the oscillation wavelength of the laser beam is around 405 nm. It is to be understood that the present invention is not limited to the case where these compounds are used as the photoresist material.

Examples of photoresist material in the case of laser oscillation wavelength around 780 nm

[Chem. 2]

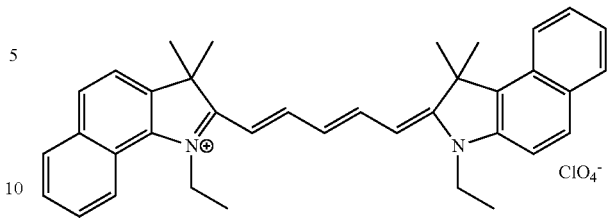
(I-2)

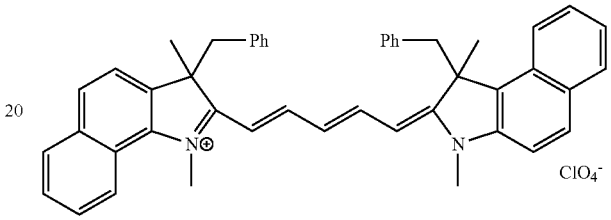
(I-3)

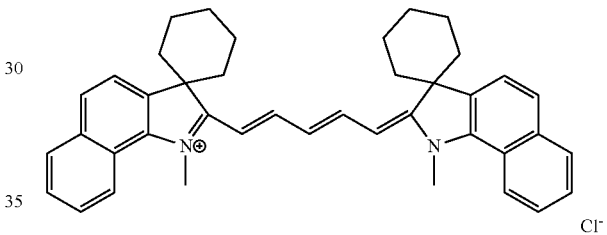
(I-4)

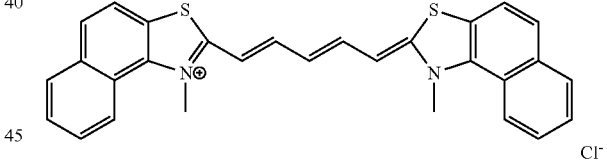
(I-5)

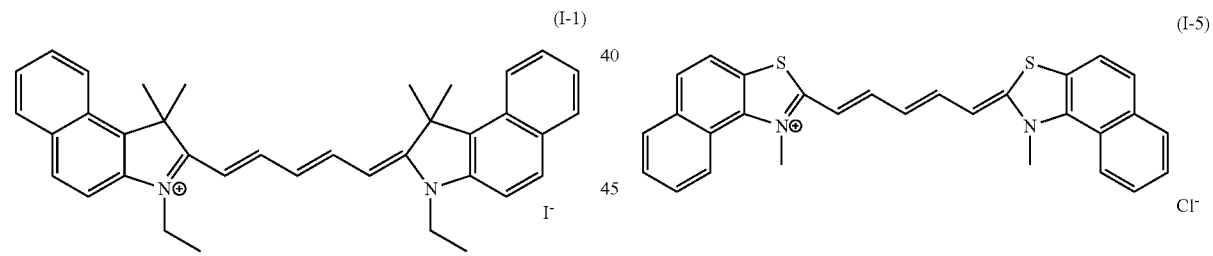
(I-1)

Examples of photoresist material in the case of laser oscillation wavelength around 780 nm

[Chem. 3]

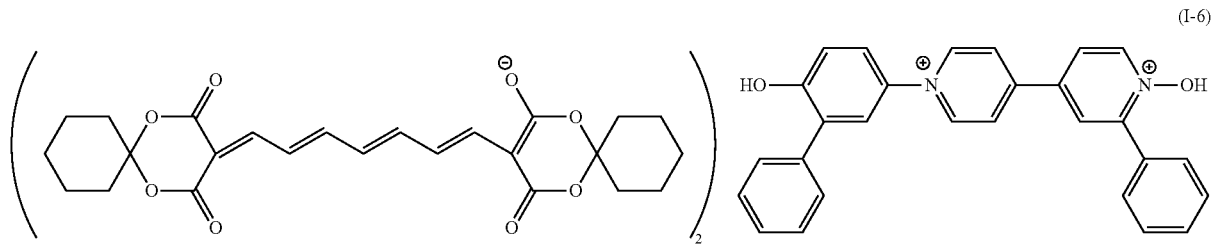
(I-6)

(I-7)
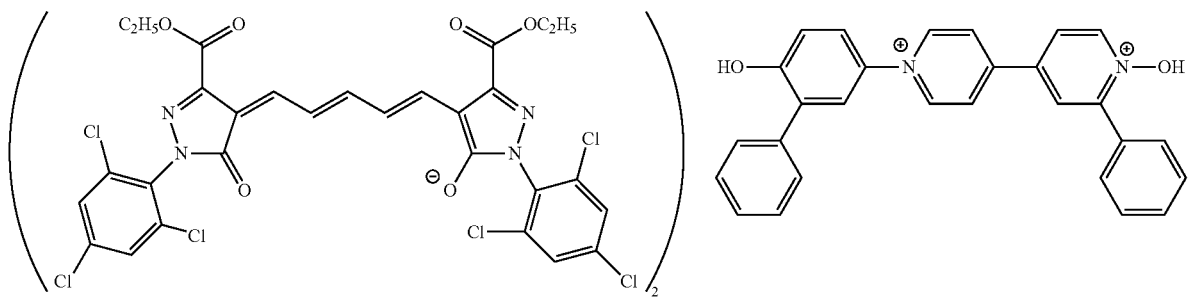
(I-8)
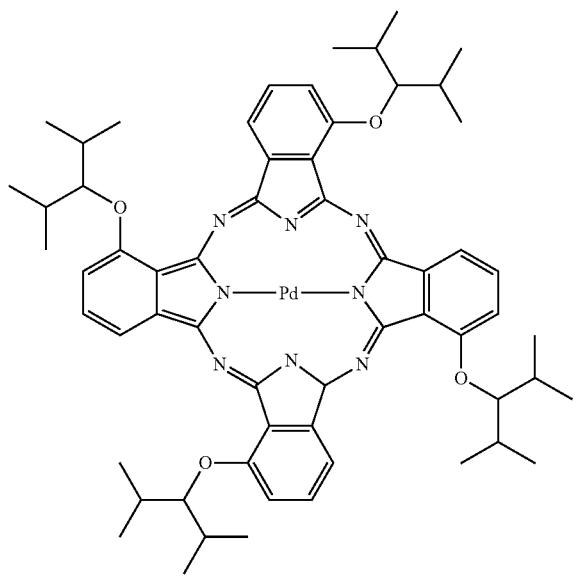
(I-9)
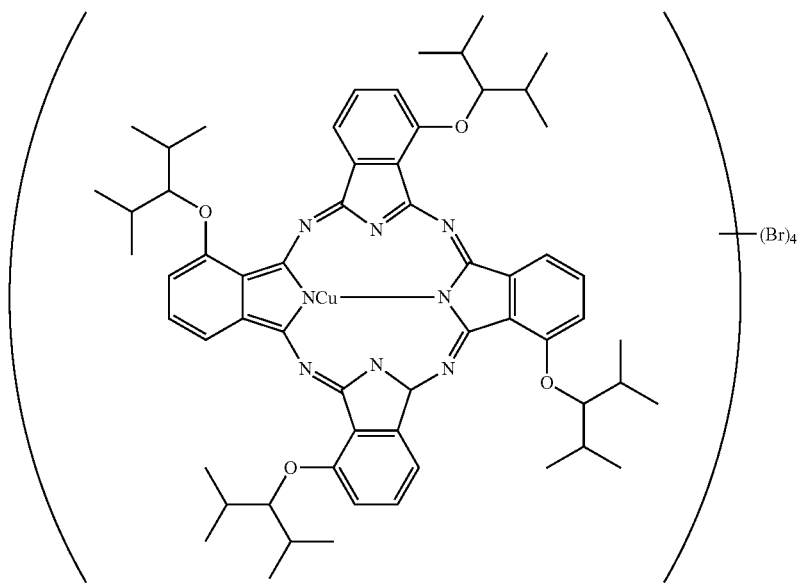

(I-10)
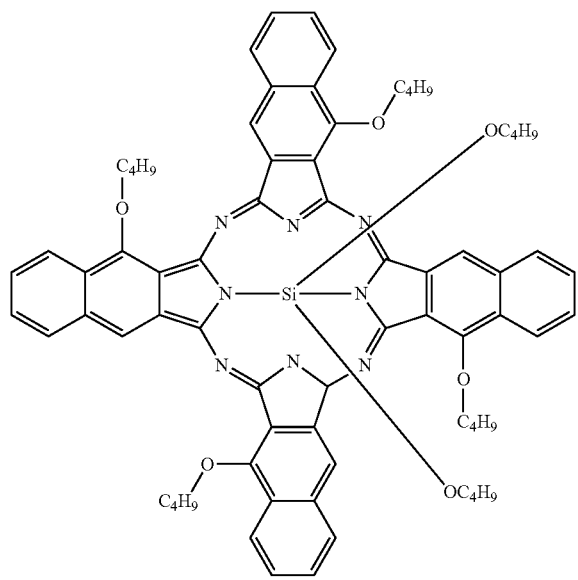
Examples of photoresist material in the case of laser oscillation wavelength around 660 nm
[Chem. 4]
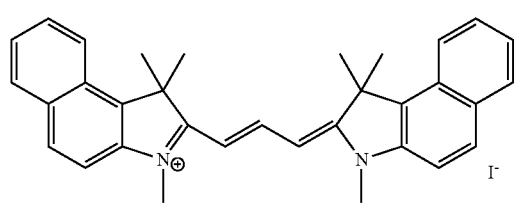
(II-1)
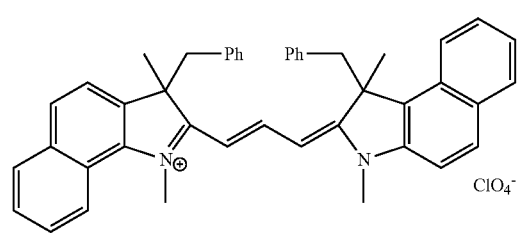
(II-2)
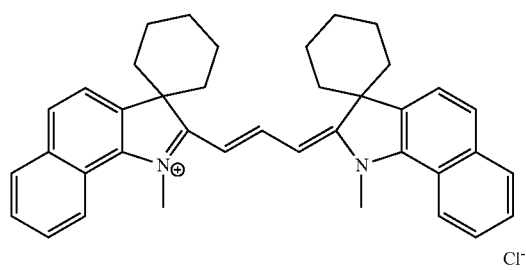
(II-3)
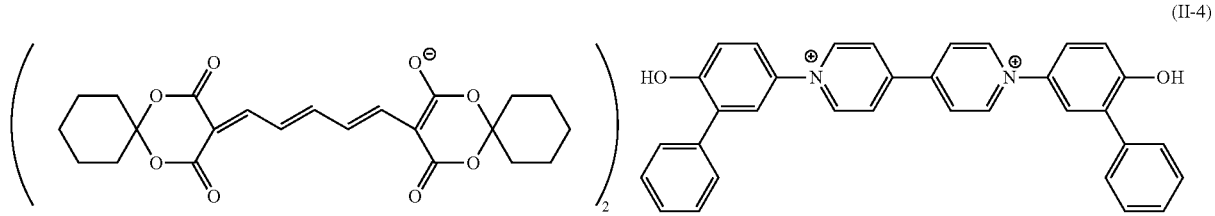
(II-4)

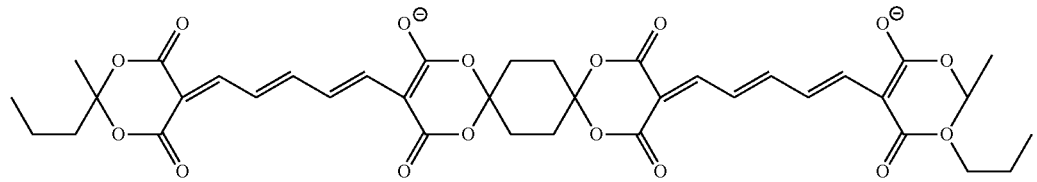
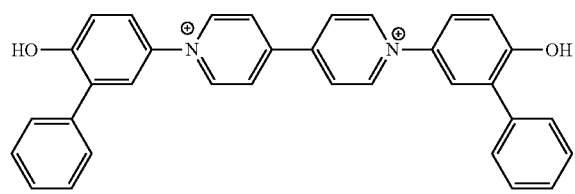
Examples of photoresist material in the case of laser oscillation wavelength around 660 nm
Examples of photoresist material in the case of laser oscillation wavelength around 405 nm
[Chem. 5]
[Chem. 6]
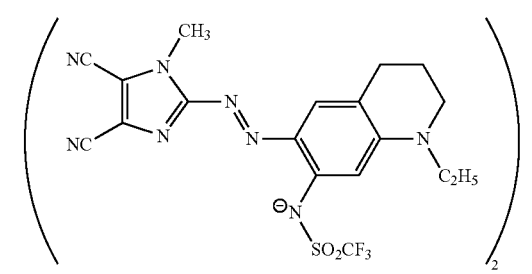
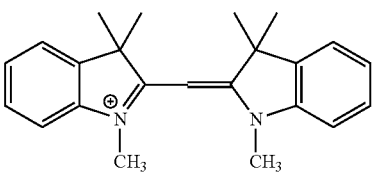
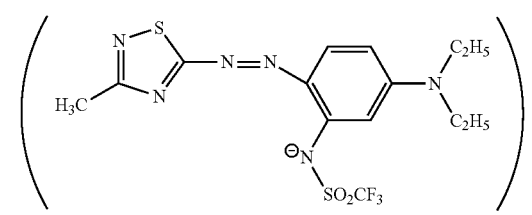
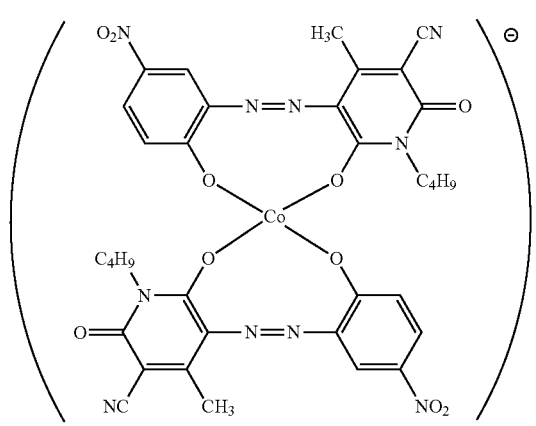
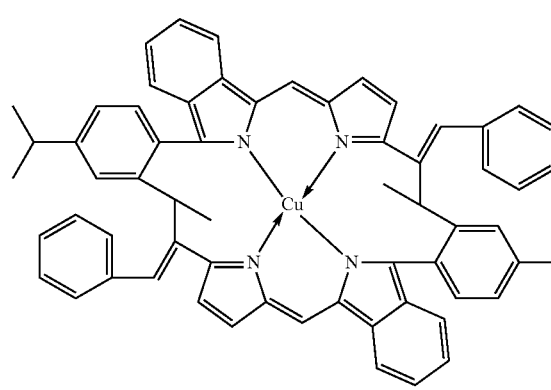
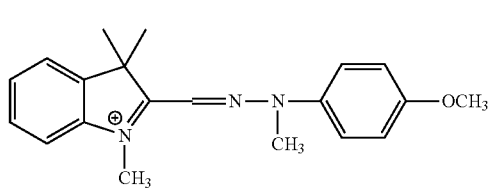

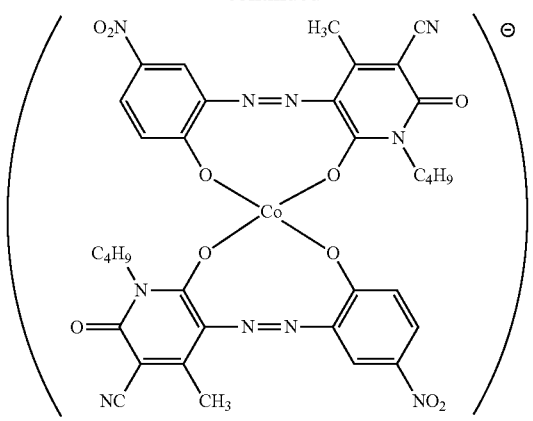
(III-3)
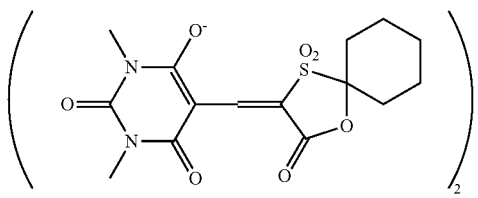
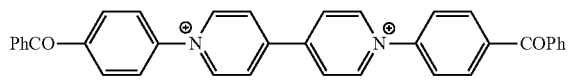
(III-4)
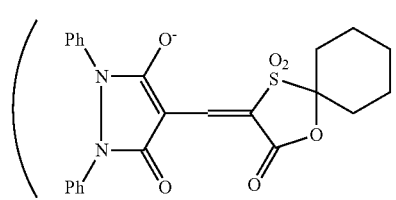
(III-5)
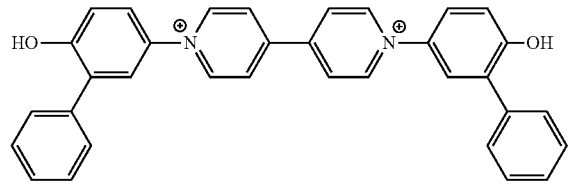
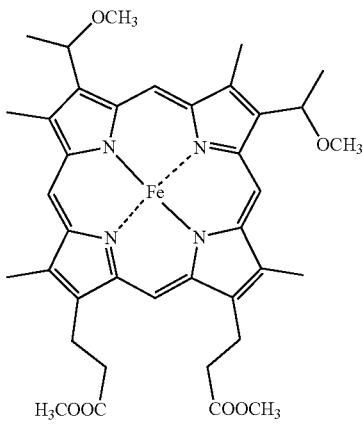
(III-6)
Examples of photoresist material in the case of laser oscillation wavelength around 405 nm
[Chem. 7]
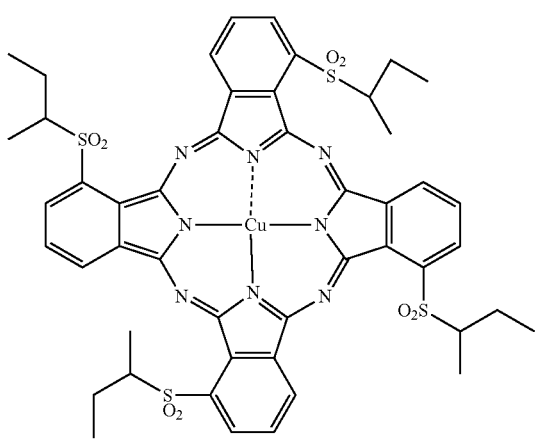
(III-7)
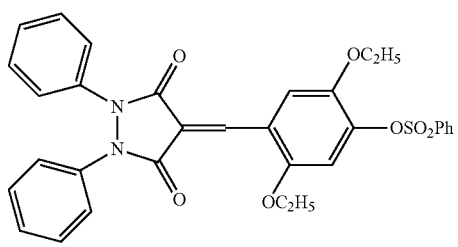
(III-8)
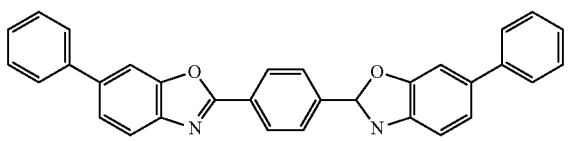
(III-9)

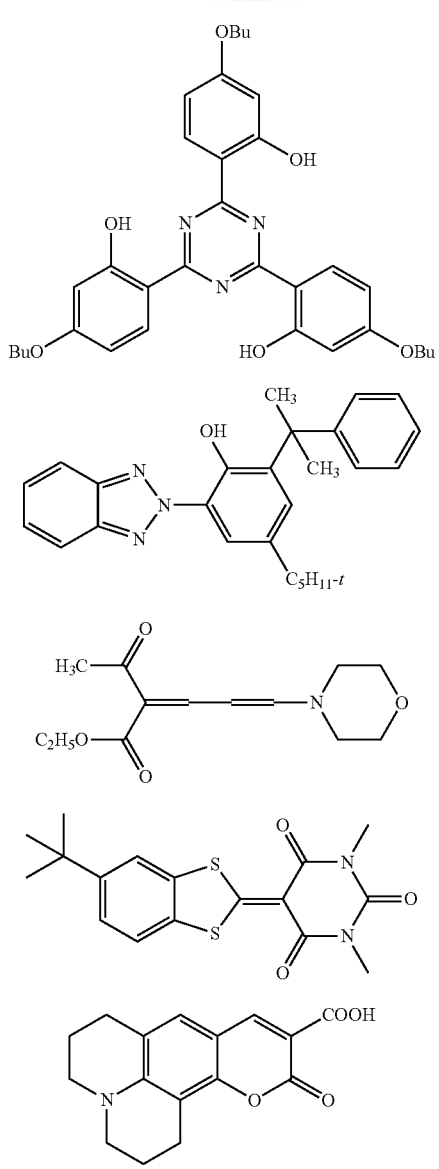

Dyes described in Japanese Laid-open Patent Applications, Publication (JP-A) Nos. 4-74690, 8-127174, 11-53758, 11-334204, 11-334205, 11-334206, 11-334207, 2000-43423, 2000-108513, and 2000-158818 can also preferably be used.

The dye-type photoresist layer 12 may be formed by dissolving a dye in an adequate solvent along with a binding agent to prepare a coating liquid, then applying the coating liquid on the substrate 11 to form a coating film, and thereafter drying the resulting coating film. In this process, the temperature of a surface on which the coating liquid is applied may preferably be in the range of 10-40 degrees centigrade. More preferably, the lower limit thereof may be 15 degrees centigrade or higher, still more preferably 20 degrees centigrade or higher, and particularly preferably 23 degrees centigrade or higher. Meanwhile, the upper limit thereof may be more preferably 35 degrees centigrade or lower, still more preferably 30 degrees centigrade or lower, and particularly preferably 27 degrees centigrade or lower. When the temperature of the coated surface is in the above ranges, uneven application of the coating and coating failure can be prevented, so that a thickness of the coating film can be made uniform.

Each of the upper and lower limits mentioned above may be arbitrarily combined with each other.

Here, the photoresist layer 12 may be either mono-layered or multi-layered. In the case of the photoresist layer 12 having a multi-layered configuration, the coating step is repeated plural times.

A concentration of the dye in the coating liquid is generally in the range of 0.01-15 mass percent, preferably in the range of 0.1-10 mass percent, more preferably in the range of 0.5-5 mass percent, and most preferably in the range of 0.5-3 mass percent.

Examples of the solvent for the coating liquid include: esters such as butyl acetate, ethyl lactate and cellosolve acetate; ketones such as methyl ethyl ketone, cyclohexanone, and methyl isobutyl ketone; chlorinated hydrocarbons such as dichloromethane, 1,2-dichloroethane and chloroform; amides such as dimethylformamide; hydrocarbons such as methylcyclohexane; ethers such as tetrahydrofuran, ethyl ether, and dioxane; alcohols such as ethanol, n-propanol, isopropanol, n-butanol, and diacetone alcohol; fluorinated solvents such as 2,2,3,3-tetrafluoropropanol; and glycol ethers such as ethylene glycol monomethyl ether, ethylene glycol monoethyl ether and propylene glycol monomethyl ether. Fluorinated solvents, glycol ethers and ketones are preferable. Particularly preferable are fluorinated solvents and glycol ethers. Further preferable are 2,2,3,3-tetrafluoropropanol and propylene glycol monomethyl ether.

Taking the solubility of the dye used in the solvents into consideration, the above solvents may be used singly or in a combination of two or more kinds thereof. Various kinds of additives such as an antioxidant, a UV absorbent, a plasticizer and a lubricant may be added in the coating liquid depending on the purpose.

The temperature of the coating liquid at the time of coating may preferably be in the range of 23-50 degrees centigrade, more preferably in the range of 24-40 degrees centigrade, and particularly preferably in the range of 25-30 degrees centigrade.

In the case where the coating liquid contains a binding agent, examples of the binding agent include natural organic polymers such as gelatin, cellulose derivatives, dextran, rosin and rubber; and synthetic organic polymers including hydrocarbonic resins such as polyethylene, polypropylene, polystylene and polyisobutylene, vinyl resins such as polyvinylchloride, polyvinylidene chloride and polyvinylchloride-polyvinyl acetate copolymers, acrylic resins such as polymethyl acrylate and polymethyl methacrylate, and initial condensates of thermosetting resins such as polyvinyl alcohol, chlorinated polyethylene, epoxy resin, butyral resin, rubber derivatives and phenol formaldehyde resin. In the case where the binding agent is used together as a material for the photoresist layer 12, the amount of the binding agent used is generally in the range of 0.01-50 times the amount of dye (mass ratio), and preferably in the range of 0.1-5 times the amount of dye (mass ratio).

In order to increase the lightfastness of the photoresist layer 12, various antifading agents may be contained in the photoresist layer 12.

In general, a singlet oxygen quencher is used for the antifading agent. As examples of such singlet oxygen quencher, those described in published documents such as patent specifications hitherto known in the art can be used.

Specific examples of such patent specifications include: Japanese Laid-open Patent Applications, Publication (JP-A) Nos. 58-175693, 59-81194, 60-18387, 60-19586, 60-19587, 60-35054, 60-36190, 60-36191, 60-44554, 60-44555, 60-44389, 60-44390, 60-54892, 60-47069, 63-209995, and 4-25492; Japanese Examined Patent Applications, Publication (JP-B) Nos. 1-38680 and 6-26028; German Patent No. 350399; and Nippon Kagaku Kaishi, October (1992), p. 1141. The use amount of the antifading agent such as a singlet oxygen quencher relative to the amount of dye is generally in the range of 0.1-50 mass percent, preferably in the range of 0.5-45 mass percent, more preferably in the range of 3-40 mass percent, and particularly preferably in the range of 5-25 mass percent.

The wavelength at which the dye exhibits the peak absorption may not necessarily fall within the range of the wavelengths of visible light, but may be within the range of the wavelengths of the ultraviolet or infrared region.

The wavelength $\lambda w$ of the laser beam at which the pattern of recessed portions 41 is formed preferably has a relationship given by $\lambda a < \lambda w$ in terms of the relation with the dye absorbing wavelength $\lambda a$. If this relationship is satisfied, the amount of light absorption of the dye is satisfactory and the formation efficiency is enhanced, and further the shape of asperities can be formed neatly.

The wavelength $\lambda w$ of the laser beam to be emitted to form a pattern of recessed portions 51 may be any wavelength as long as a sufficiently high laser power is obtained. For example, the wavelength may preferably be 1,000 nm or less, such as 193 nm, 210 nm, 266 nm, 365 nm, 405 nm, 488 nm, 532 nm, 633 nm, 650 nm, 680 nm, 780 nm, and 830 nm.

The laser beam may be any kind of laser such as gas laser, solid-state laser, and semiconductor laser. However, in order to simplify the optical system, the use of the solid-state laser or the semiconductor laser is preferable. The laser beam may be a continuous light beam or pulsed light beam. However, it is preferable to use a laser beam whose emission intervals can be changed freely. For example, the use of a semiconductor laser is preferable. In the case where the laser beam is not directly on-off keyed, it is preferable that the laser beam is modulated using an external modulation element.

In order to increase the processing speed, a higher laser power is preferable. However, the higher the laser power, the higher scanning speed (speed for scanning the photoresist layer 12 with the laser beam) is required. For this reason, taking the upper limit value of the scanning speed into consideration, the upper limit value of the laser power is preferably 100 W, more preferably 10 W, and still more preferably 5 W, and most preferably 1 W. Meanwhile, the lower limit value of the laser power is preferably 0.1 mW, more preferably 0.5 mW, and still more preferably 1 mW.

It is preferable that the laser beam excels in oscillation wavelength and coherency, and that the laser beam can be condensed to a spot size which is as small as the wavelength of the laser beam. Further, as a light exposure strategy (i.e., optical pulse illumination conditions for appropriately forming a pattern of recessed portions 41), it is preferable that the strategy used for optical discs is employed. To be more specific, conditions required for the manufacture of optical discs, such as light exposure speed, peak value of the illuminating laser beam, and pulse width, are preferably used.

It is preferable that vaporization, sublimation or decomposition of the photoresist layer 12 has a high rate of change which is precipitous. To be more specific, the weight decreasing rate obtained by a thermo gravimetry differential thermal analyzer (TG-DTA) during vaporization, sublimation or decomposition of the photoresist layer 12 is preferably 5% or more, more preferably 10% or more, and most preferably 20% or more. Further, the slope of weight decrease (weight decreasing rate per elevated temperature of 1° C.) obtained by the thermo gravimetry differential thermal analyzer (TG-DTA) during vaporization, sublimation or decomposition of the photoresist layer 12 is preferably 0.1%/° C. or more, more preferably 0.2%/° C. or more, and most preferably 0.4%/° C.

The upper limit value of the transition temperature of the chemical change or/and the physical change such as softening, liquefaction, vaporization, sublimation, and decomposition is preferably 2000° C. or less, more preferably 1000° C. or less, and most preferably 500° C. or less. This is because if the transition temperature is too high, a higher laser power is required. On the contrary, the lower limit value of the transition temperature is preferably 50° C. or more, more preferably 100° C. or more, and most preferably 150° C. or more. This is because if the transition temperature is too low, the temperature gradient from the environment is small so that the shape of an edge of a hole is not formed clearly.

EXAMPLE

In order to prove advantageous effects of the present invention, examples will be described below.

As with the above exemplary embodiment, a circular plate-shaped substrate was prepared, and a photoresist layer having 100 nm thickness was formed on the substrate. As an example of a transparent sheet, a polycarbonate film having 0.1 mm thickness is disposed on the photoresist layer so as to contact with the photoresist layer, and the photoresist layer is exposed to light through the polycarbonate film. The substrate and the polycarbonate film are retained with a chuck at their inner perimeter portions of the center holes.

Details of each component were as follows.

Substrate
 Material: Silicon
 Thickness: 0.6 mm
 Outer diameter: 10.2 cm (4 inches)
 Inner diameter: 15 mm Dye layer (Photoresist layer)
 2 g of a dye material given by the above chemical formula 1 was dissolved in 100 ml of TFP (tetrafluoropropanol) solvent, and the resulting solution was spin coated. In this spin-coating process carried out with a dispense-start rotation speed of 500 rpm and a dispense-end rotation speed of 1,000 rpm, a coating liquid was dispensed onto the inner-radius area of the substrate, and the rotation speed was gradually increased to 2,200 rpm. The refractive index n of the dye material was 1.986 and the extinction coefficient k of the dye material was 0.0418.

In the above substrate, fine recessed portions were formed from its photoresist layer side surface using DDU1000 (wavelength: 405 nm, NA: 0.85) manufactured by Pulstec Industrial Co., Ltd. The recessed portions were formed as a spiral shaped groove having 0.2 μm width and 0.5 μm pitch.

Conditions for forming the recessed portions were as follows.
 Laser output: 2 mW
 Linear velocity: 5 m/s
 Exposure signal: Square wave of 5 MHz According to the processes as described above, fine recessed portions were formed in the photoresist layer. After formation of the recessed portions, the object lens was carefully checked to see if scattered materials from the photoresist material were attached. However, no scattered materials were found. Thereafter, the obtained photoresist layer was used as a mask and dry etching was successfully performed.

Conditions of the dry etching were as follows.
 Etching gas: $SF_6+CHF_3$ (1:1)
 Depth of recessed portions: 50 nm
 Stripping agent for stripping the photoresist layer, etc.: Ethanol

EXAMPLE 2

$SiO_2$ fine particles having the mean particle diameter of 1 μm were sparsely interposed between the photoresist layer and the polycarbonate film, and the polycarbonate film was fixed to the substrate using a chuck. Other conditions were the same as those described in EXAMPLE 1, and the test piece was prepared accordingly.

The polycarbonate film of this test piece was locally pressed by a finger against the photoresist layer. However, no interference fringes were generated.

Thereafter, the exposure of the photoresist layer was carried out under the same conditions as those of EXAMPLE 1. There were no problems on focusing, and fine recessed portions were formed in the photoresist layer. The obtained photoresist layer was used as a mask and dry etching was successfully performed by the same conditions as those of EXAMPLE 1.

COMPARATIVE EXAMPLE 1

The polycarbonate film provided in the test piece of EXAMPLE 1 was omitted to prepare a test piece. The exposure of the photoresist layer was carried out under the same conditions as those of EXAMPLE 1. The optical system was modified so that focus was achieved on the photoresist layer.

After the exposure, the object lens was carefully checked. A slight amount of scattered materials was observed.

COMPARATIVE EXAMPLE 2

Using the test piece of EXAMPLE 1, the polycarbonate film was locally pressed by a finger against the photoresist layer. As a result, interference fringes were observed.

While the interference fringes remained present, the exposure of the photoresist layer was carried out under the same conditions as those of EXAMPLE 1. The exposure device could not perform a stable focusing, and recessed portions were not formed in the photoresist layer.

The invention claimed is:

1. A method for processing a workpiece having a photoresist layer using an exposure device, the method comprising the steps of:
    disposing an object which allows transmission of light emitted from the exposure device, between an object lens of the exposure device and the photoresist layer; and
    exposing the photoresist layer to the light through the object,
    wherein the object is transparent to the light and disposed to contact with the photoresist layer through fine particles, so that a space is formed between the photoresist layer and the object substantially corresponding to a mean particle diameter of the fine particles.

2. The processing method according to claim 1, wherein the photoresist layer is made of a thermally deformable heat mode-type material.

3. The processing method according to claim 1, wherein the photoresist layer is exposed to light and subsequently the workpiece is etched using the photoresist layer as a mask.

4. The processing method according to claim 1, wherein the mean particle diameter is in a range of 0.01-100 µm.

5. The processing method according to claim 1, wherein the exposing step comprises rotating the workpiece while the workpiece is exposed to light.

6. The processing method according to claim 5, wherein the exposing step comprises fixing the object to the workpiece using a clamp.

7. The processing method according to claim 5, wherein the exposing step comprises bonding the object to the workpiece prior to the exposure of the photoresist layer in such a manner that the object is removable from a surface of the photoresist layer to be processed.

8. The processing method according to claim 1, wherein the object has a sheet-like configuration.

9. The processing method according to claim 8, wherein the sheet-like object has a thickness in a range of 1-80% of a distance between the object lens and the photoresist layer.

10. The processing method according to claim 1, wherein the mean particle diameter is in a range of 0.5-100 µm.

11. The processing method according to claim 1, wherein a rate of the fine particles disposed within a given area of a surface of the photoresist layer is equal to or less than 1%.

12. The processing method of claim 1 where the object is transmissive to light over an entire region of the object.

* * * * *